United States Patent
Tavabi et al.

(10) Patent No.: US 10,607,804 B2
(45) Date of Patent: Mar. 31, 2020

(54) TUNABLE CHARGED PARTICLE VORTEX BEAM GENERATOR AND METHOD

(71) Applicant: Forschungszentrum Jülich GmbH, Jülich (DE)

(72) Inventors: Amir Tavabi, Jülich (DE); Penghan Lu, Jülich (DE); Martial Duchamp, Düren (DE); Rafal Edward Dunin-Borkowski, Jülich (DE); Giulio Pozzi, Bologna (IT)

(73) Assignee: Forschungszentrum Jülich GmbH (DE)

( * ) Notice: Subject to any disclaimer, the term of this patent is extended or adjusted under 35 U.S.C. 154(b) by 0 days.

(21) Appl. No.: 16/330,982

(22) PCT Filed: Sep. 7, 2016

(86) PCT No.: PCT/EP2016/071029
§ 371 (c)(1),
(2) Date: Mar. 6, 2019

(87) PCT Pub. No.: WO2018/046079
PCT Pub. Date: Mar. 15, 2018

(65) Prior Publication Data
US 2019/0259561 A1    Aug. 22, 2019

(51) Int. Cl.
*H01J 37/06*    (2006.01)
*H01J 37/20*    (2006.01)
(Continued)

(52) U.S. Cl.
CPC ........... *H01J 37/06* (2013.01); *H01J 3/02* (2013.01); *H01J 3/021* (2013.01); *H01J 37/08* (2013.01);
(Continued)

(58) Field of Classification Search
USPC ................... 250/306, 307, 310, 311
See application file for complete search history.

(56) References Cited

U.S. PATENT DOCUMENTS

2005/0109879 A1* 5/2005 Patterson ............... F03H 99/00
                                                                244/53 R
2013/0193322 A1   8/2013 Blackburn
(Continued)

FOREIGN PATENT DOCUMENTS

WO    2016015739 A1    2/2016

OTHER PUBLICATIONS

International Search Report and Written Opinion for PCT/EP2016/071029 dated May 15, 2017.

*Primary Examiner* — Kiet T Nguyen
(74) *Attorney, Agent, or Firm* — Barnes & Thornburg LLP

(57) ABSTRACT

The present invention refers to a device for generating charged particle beams with tunable orbital angular momentum. The device firstly includes one or more components for providing a charged particle beam. It is further characterized by an electrical arrangement for imparting a tunable orbital angular momentum to the charged particle beam during operation. The orbital angular momentum of the produced charged particle vortex beam is tunable by adjusting the amount of electrical current. The chirality of the produced charged particle vortex beam is switchable by reversing the direction of the electrical current. The generation of the charged particle vortex beam from the present invention does not depend on the energy of the charged particle beams. The generation of the charged particle vortex beams from the present invention is predictable and reproducible.

17 Claims, 4 Drawing Sheets

(51) Int. Cl.
  *H01J 37/244* (2006.01)
  *H01J 37/26* (2006.01)
  *H01J 37/08* (2006.01)
  *H01J 3/02* (2006.01)

(52) U.S. Cl.
  CPC ............ *H01J 37/20* (2013.01); *H01J 37/244* (2013.01); *H01J 37/26* (2013.01); *H01J 2237/06383* (2013.01); *H01J 2237/2614* (2013.01)

(56) References Cited

U.S. PATENT DOCUMENTS

| | | |
|---|---|---|
| 2014/0346353 A1 | 11/2014 | Verbeeck et al. |
| 2014/0346354 A1 | 11/2014 | Verbeeck et al. |
| 2018/0273865 A1* | 9/2018 | Leskosek ............... C10L 3/08 |

* cited by examiner

TUNABLE CHARGED PARTICLE VORTEX BEAM GENERATOR AND METHOD

CROSS-REFERENCE TO RELATED APPLICATIONS

This application is a national stage entry under 35 USC § 371 of PCT International Application Number PCT/EP2016/071029, filed 7 Sep. 2016, the entire disclosures of each of which is expressly incorporated by reference herein.

The present invention refers to a charged particle vortex beam generator which can impart an orbital angular momentum to a charged particle beam and a method for generating a charged particle vortex beam. The device comprises one or more components for providing a charged particle beam. The device further comprises means for imparting an orbital angular momentum to the charged particle beam. Such a device generates a charged particle vortex beam.

A charged particle is a particle with an electric charge. Elementary particles like electrons, protons, positrons are charged particles. A charged particle may be a molecule or atom with a surplus or deficit of electrons relative to protons. A further example is an alpha particle.

The term charged particle vortex beam refers to a beam of free propagating charged particles having the property that the orbital angular momentum about its axis of propagation is different from zero and possibly quantized. Optical vortices have paved the way, showing many diverse applications like optical tweezers and spanners for various applications, including micromanipulation, phase contrast imaging, classical and quantum communications [David L Andrews and Mohamed Babiker. The angular momentum of light, Cambridge University Press, 2012]. Similar successes can be reached in the field of electron microscopy, where electron vortex beams could be used to investigate the magnetic behavior of materials at atomic or near atomic resolution, to manipulate nanoparticles or to measure the microscope optical parameters [Ondrej L Krivanek, Jan Rusz, Juan-Carlos Idrobo, Tracy J Lovejoy, and Niklas Dellby. Toward single mode, atomic size electron vortex beams. Microscopy and Microanalysis, 20(03):832-836, 2014]. In analogy to optics [Alexander Jesacher, Severin Fürhapter, Stefan Bernet, and Monika Ritsch-Marte. Shadow effects in spiral phase contrast microscopy, Physical Review Letters, 94(23):233902, 2005; Stefan Bernet, Alexander Jesacher, Severin Fürhapter, Christian Maurer, and Monika Ritsch-Marte. Quantitative imaging of complex samples by spiral phase contrast microscopy. Optics Express, 14(9):3792-3805, 2006; Severin Fürhapter, Alexander Jesacher, Christian Maurer, Stefan Bernet, and Monika Ritsch-Marte. Spiral phase microscopy. Advances in Imaging and Electron Physics, 146:1-56, 2007], it is also envisaged the production of phase plates able to improve the contrast of biological specimens with low absorption contrast [A. M. Blackburn and J. C. Loudon. Vortex beam production and contrast enhancement from a magnetic spiral phase plate. Ultramicroscopy, 136(0):127-143, 1 2014].

The production of an electron vortex beam can be made in several ways: by a thin film of suitably varying thickness imprinting on the electron beam the spirally increasing phase [Masaya Uchida and Akira Tonomura. Generation of electron beams carrying orbital angular momentum. Nature, 464(7289):737-739, 2010], by holographic fork apertures [Johan Verbeeck, He Tian, and Peter Schattschneider. Production and application of electron vortex beams. Nature, 467(7313):301-304, 2010; Benjamin J McMorran, Amit Agrawal, Ian M Anderson, Andrew A Herzing, Henri J Lezec, Jabez J McClelland, and John Unguris. Electron vortex beams with high quanta of orbital angular momentum. Science, 331(6014):192-195, 2011], by holographic spiral apertures [Jo Verbeeck, He Tian, and Armand Béché. A new way of producing electron vortex probes for STEM. Ultramicroscopy, 113:83-87, 2012; Koh Saitoh, Yuya Hasegawa, Nobuo Tanaka, and Masaya Uchida. Production of electron vortex beams carrying large orbital angular momentum using spiral zone plates. Journal of Electron Microscopy, 61:171-177, 2012], by manipulating the aberration function [L Clark, A Béché, G Guzzinati, A Lubk, M Mazilu, R Van Boxem, and J Verbeeck. Exploiting lens aberrations to create electron-vortex beams. Physical review letters, 111(6):064801, 2013], or by using the magnetic field surrounding the sharp tip of a dipole magnet [A. M. Blackburn and J. C. Loudon. Vortex beam production and contrast enhancement from a magnetic spiral phase plate. Ultramicroscopy, 136(0):127-143, 2014; Armand Béché, Ruben Van Boxem, Gustaaf Van Tendeloo, and Jo Verbeeck. Magnetic monopole field exposed by electrons. Nature Physics, 10(1):26-29, 2014]. The latter method, subject of two patents (as vortex wave generation US 2014/0346354 A1, or phase plate US 20130193322 A1) is based on the magnetic Aharonov-Bohm effect. However, owing to difficulties linked to varying the magnetization, the device suffers from limited tunability. A self-charging rod may be used for imparting an orbital angular momentum to an electron beam [A. M. Blackburn. Observation of an electron vortex beam created from a self-charging rod. Microsc. Microanal. 22 (S3): 1710-1711, 2016]. Such an electron vortex beam may have use in electron microscopy for characterizing the magnetic and chiral properties of materials.

Charged particle vortex beam generators known from the state of the art are not tunable, are not switchable and require a large production effort and/or an adjustment effort, for example due to a dependency on the energy of the charged particle beam. It is the object of the present invention to overcome at least one of these drawbacks.

The object of the invention is solved by a device comprising the features of claim 1 and a method comprising the features of the independent claim and preferably comprising the features of one or more of the dependent claims.

For solving the object of the invention, a charged particle vortex beam generator comprises one or more components for providing a charged particle beam. The device further comprises an electrical arrangement for imparting an orbital angular momentum to the charged particle beam during operation. As a result, there will be a charged particle vortex beam.

The electrical arrangement provides a first electrical current flowing in a first direction and a second electrical current flowing in a second opposite direction. In other words, the first direction is antiparallel to the second direction. There are one or more electrical conductors for the first electrical current and the second electrical current. As a rule, the ends of the electrical conductors respectively of corresponding electrical conductor sections are situated adjacent to each other. As a result, the end of the second electrical current is situated adjacent to the start of the first electrical current and vice versa. Adjacent to each other means at least in the neighborhood. The charged particle beam and said first electrical current direction of the electrical current forms an acute angle. Consequently, there is also an acute angle formed by the second electrical current direction and the charged particle beam. An acute angle is an angle less than 90°. As a rule and with the exception of the flowing direction, the first electrical current equals the second electrical current.

In an embodiment of the invention, the charged particle beam illumination area is restricted to the apex of two electrical currents.

In an embodiment of the invention, the first electrical conductor and the second electrical conductor are situated within the charged particle beam. Thus, the diameter of the charged particle beam (and consequently the charged particle beam illumination area) is greater than the dimensions of the two electrical conductors in a preferred embodiment of the invention.

In an embodiment of the invention, one electrical current flowing in the first direction is arranged at one side of the center of the charged particle beam and the other electrical current flowing in the second opposite direction is arranged at the other side of the center of the charged particle beam during operation.

In an embodiment of the invention, the electrical current flowing in the first or second direction ends at the center of the charged particle beam or at least nearby the center of the charged particle beam.

In an embodiment of the invention, the electrical current flowing in the first direction flows along a straight line and the electrical current flowing in the second direction also flows along a straight line. Thus, corresponding electrical conductors or corresponding sections of a conductor are linear in a preferred embodiment. However, this does not mean that further shapes are excluded or impossible. It is for example also possible to suitably shape the current in the direction along the beam in order either to improve the quality of the vortex beam or to create more exotic beams.

For providing an electrical current flowing in the first and second direction, there is at least one electrical conductor. Thus, the device may comprise a first electrical conductor for providing the electrical current that flows in the first direction and a second electrical conductor separated from the first electrical conductor for providing the electrical current which flows in the second direction. The electrical conductors are tilted with regard to the charged particle beam. There is an angle of less than 90 degrees formed between each of said electrical conductors and the charged particle beam. In a preferred embodiment of the invention, the angle is less than 70°, preferably less than 60°. In a preferred embodiment, the angle is more than 20°, preferably more than 30°.

The resulting vortex beam of the charged particle vortex beam generator is tunable by varying the electrical current and thus in a very easy manner. In other words, it is possible to adjust the imparted angular momentum by varying the electric current or electric currents.

The chirality of the produced vortex beam of the charged particle vortex beam generator is switchable in a very easy manner by varying the direction of the electrical current or electrical currents.

The vortex beam of the charged particle vortex beam generator does not depend on the energy of the charged particle beam. The adjustment effort is low for this reason.

The production effort is low.

Further, the charged particle beam device can act as a wave flattener.

The vortex beam of the charged particle vortex beam generator is predictable and reproducible.

In a simple embodiment of the invention, the electrical arrangement comprises only one electrical conductor for providing an electrical current which flows in the first direction and an electrical current which flows in the second direction. Two legs or sections of the electrical conductor on one side and the charged particle beam on the other side make an angle of less than 90° during operation, for example less than 80°, preferably of less than 70° or 60° for providing an appropriate electrical current which can impart an orbital momentum to the charged particle beam. As soon as an electrical current flows through the electrical conductor, the electrical arrangement can impart an orbital angular momentum to a charged particle beam. This embodiment further reduces the manufacturing effort.

Two legs of the electrical conductor on one side and the charged particle beam on the other side make an acute angle of more than 20° during operation, for example more than 30° for providing an appropriate electrical current which can impart an orbital momentum to the charged particle beam. As soon as an electrical current flows through the electrical conductor, the electrical arrangement can impart an orbital angular momentum to a charged particle beam. This embodiment further reduces the manufacturing effort.

In a simple embodiment of the invention, the electrical conductor is U-shaped.

In a preferred embodiment of the invention, the distance between the two electrical conductors or sections of an electrical conductor for the first and second electrical current is less than 1 µm, preferably less than 0.5 µm. Thus, the distance between the two legs of the U-shaped electrical conductor is less than 1 µm, preferably less than 0.5 µm.

In a preferred embodiment of the invention, the diameter, the width and/or the height of the two electrical conductors or sections of an electrical conductor for the first and second electrical current are less than 1 µm, preferably less than 0.5 µm.

In a preferred embodiment of the invention, the first current and second electrical current are not more than 50 mA, preferably not more than 10 mA.

In a simple embodiment of the invention, the electrical conductor or conductors are formed from metal, preferably from Pt, Au or Cu.

In a preferred embodiment of the invention, the electrical conductor or conductors are formed from a superconducting material for realizing charged particle vortex beams with larger orbital angular momentum.

In a simple embodiment of the invention, the electrical conductor is disposed on a substrate and/or on a thin film. As a rule, the surface of the substrate is flat for reducing the production effort.

In a simple embodiment of the invention, the substrate is formed from Si.

In a simple embodiment of the invention, the film is formed from SiN.

The components for providing a charged particle beam include in a preferred embodiment of the invention a charged particle beam source to generate a charged particle beam.

The components for providing a charged particle beam include in a preferred embodiment of the invention a focusing lens to focus the charged particle beam onto the electrical arrangement and/or onto a specimen.

The components for providing a charged particle beam include in a preferred embodiment of the invention an aperture system for defining an aperture for the charged particle beam.

The components for providing a charged particle beam include in a preferred embodiment of the invention a magnetic component and/or an electrostatic component to shape the charged particle beam.

The aperture system includes in a preferred embodiment of the invention one or more members to block one or more portions of the charged particle beam.

The aperture system blocks in a preferred embodiment of the invention one or more portions of the charged particle beam between the charged particle beam source and the focusing lens.

The charged particle vortex beam generator is in a preferred embodiment of the invention a scanning particle system for scanning a focused charged particle beam across a specimen to inspect the specimen.

The charged particle vortex beam generator is in a preferred embodiment of the invention a scanning electron microscope to probe a specimen.

The charged particle vortex beam generator is in a preferred embodiment of the invention a transmission microscope or a scanning transmission microscope.

In a preferred embodiment of the invention, the charged particle vortex beam generator comprises a holder for holding a specimen. Further, the electrical arrangement is arranged between the holder and the components for providing a charged particle beam. This embodiment allows the characterization of a specimen in an easy manner.

In a preferred embodiment of the invention, the device or generator comprises a detection unit and/or an evaluation unit for detecting a charged particle vortex beam and/or for characterizing the properties of a probe. This embodiment allows the characterization of a specimen in an automatic manner or at least in a half-automatic manner.

For solving the object of the invention, a method for generating a charged particle vortex beam comprises the steps:
generating a charged particle beam,
providing an electrical arrangement so that a first electrical current flows in a first direction and a second electrical current flows in a second opposite direction, wherein the first direction is anti-parallel to the second direction,
directing the charged particle beam through the first electrical current and the second electrical current so that the electrical arrangement imparts an orbital angular momentum to the charged particle beam.

In a preferred embodiment, the first electrical current and the second electrical current flow within the charged particle beam in a tilted manner relative to the particle beam path. In an embodiment, the first electrical current and the second electrical current are completely arranged within the charged particle beam. In this case, the diameter of the charged particle beam is greater than the distances between the outer boundaries of the first electrical current and the second electrical current. Preferably, the electron beam illumination area (1) should be only restricted to the apex of two electrical currents.

These and other features of the present invention will become more apparent from the following description of the illustrative embodiments.

Figure 1:
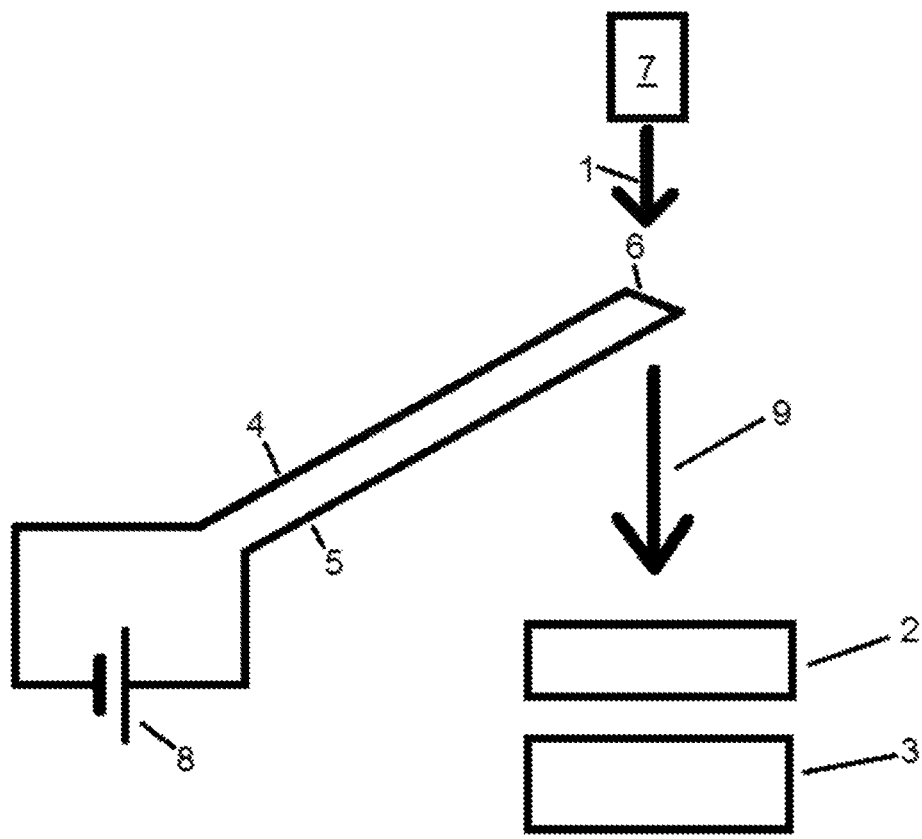
FIG. 1 shows a charged particle vortex beam generator of a first embodiment.

FIG. 1 illustrates the path of a charged particle beam 1 flowing towards a holder 2 for holding a specimen and detection and evaluation unit 3 during operation. During operation, there is an electrical current flowing in a first direction along the first section 4 of an electrical conductor. There is an electrical current flowing in a second opposite direction along the second section 5 of the electrical conductor. The electrical current flowing direction flowing along the first section 4 is thus antiparallel with the electrical current flowing direction flowing along the second section 5. Each flowing direction is tilted with respect to the charged particle beam 1. Thus, there is an electrical arrangement which imparts an orbital angular momentum to the charged particle beam 1 during operation due to the sections 4 and 5 of the electrical conductor.

A third section 6 connects the first section 4 with the second section 5. The sections 4, 5 and 6 of the electrical conductor are shaped in a "U"-like manner. As a result, the end of a first electrical current flowing along the first section 4 is situated adjacent to the start of a second electrical current flowing along the second section 5. The end of the second electrical current is situated adjacent to the start of the first electrical current. The center of the charged particle beam 1 is arranged nearby the section 6 of the electrical conductor and thus nearby the corresponding ends of the first section 4 and the second section 5 of the electrical conductor.

The charged particle vortex beam generator comprises components 7 for providing the charged particle beam 1. The first electrical conductor section 4 in the form of a leg is arranged on one side of the center of the charged particle beam 1 and the second electrical conductor section 5 in the form of a leg is arranged on the other side of the center of the charged particle beam 1. There is an electrical power supply 8 connected with the ends of the first section 4 and the second section 5 opposite to the third section 6.

Such an electrical arrangement imparts an orbital angular momentum to the charged particle beam 1 during operation. The angular momentum depends on the electrical current flowing through the first and second sections 4 and 5 but not on the energy of the charged particle beam. A charged particle vortex beam 9 will be generated.

An angle α of less than 90 degrees is formed between each electrical conductor section 4 or 5 and the charged particle beam 1. The electrical conductor which is composed of the three sections 4, 5 and 6 is connected to a DC voltage source 8 so that there is a component of an electrical current flow parallel to the charged particle beam 1 on one side and a component of an electrical current flow antiparallel to the charged particle beam 1 on the other side during operation. As a result, there will be a charged particle vortex beam 9. Thus, the device can be realized by setting two parallel conductive lines 4, 5 having flowing currents in opposite directions and having a tilt angle with respect to the direction of the charged particle beam 1.

Figure 2:
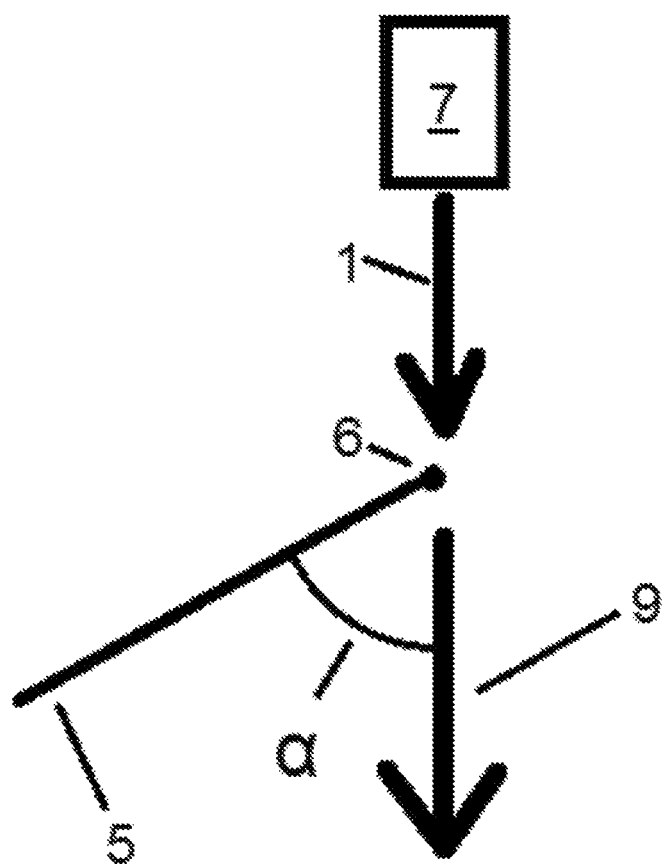
FIG. 2 is a side view on parts of the charged particle vortex beam generator shown in FIG. 1.

FIG. 2 is a side view on parts of the particle vortex beam generator shown in FIG. 1. FIG. 2 illustrates the presence of an acute angle α of less than 90 degrees which is formed between the electrical conductor section 5 and the charged particle beam 1. The electrical conductor section 5 and the electrical conductor section 4 are located at the same height. Further, the two conductor sections 4 and 5 are parallel. Thus, there is a corresponding acute angle α of less than 90 degrees which is formed between the electrical conductor section 4 and the charged particle beam 1.

The charged particle vortex beam 9 of the charged particle vortex beam generator illustrated by FIG. 1 and FIG. 2 is tunable by varying the electrical current. The chirality of the charged particle vortex beam 9 of the charged particle vortex beam generator is switchable by varying the direction of the electrical current. The vortex beam 9 of the charged particle vortex beam generator does not depend on the energy of the charged particle beam 1.

Figure 3:
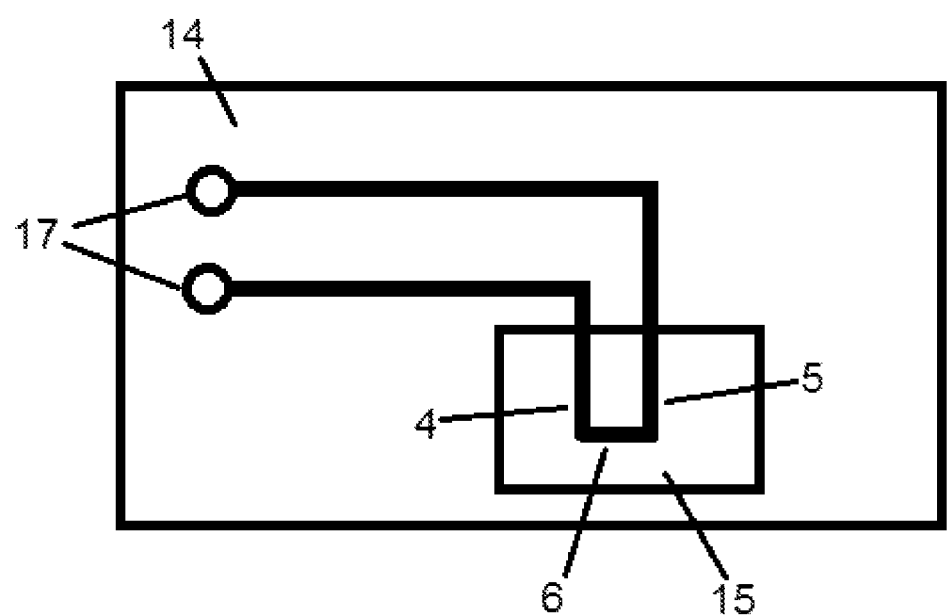
FIG. 3 shows a circuit path formed on a flat surface of a substrate for a charged particle vortex beam generator.

In order to realize the effects, a charged particle vortex beam generator has been constructed as follows. A substrate 14 formed from Si comprising a thin film 15 on a flat surface has been provided. A circuit path was formed on the flat surface by deposition as shown in FIG. 3. The circuit path comprises the above mentioned sections 4, 5 and 6 in the form of a "U". The circuit path was formed by Pt. The distance between the sections 4 and 5 of the electrical conductor and thus the length of the section 6 were 200 nm. The circuit path comprise two pins 17 for a power supply. The width of the sections 4 and 5 on the film 15 was 200 nm.

The substrate has been placed in an electron microscope in a tilted manner so that there is an angle α of about 60° to 70° between the sections 4 and 5 and the electron beam 1 of the electron microscope for providing a tunable and predictable electron vortex beam which does not depend on the energy of the electron beam of the electron microscope. The energy of the electron beam could be varied between 50 keV and 300 keV. An electrical current of a few mA is sufficient for providing the electron vortex beam 9. At least in connection with an electron microscope, an angle α of 60° to 70° is preferred.

Figure 4:
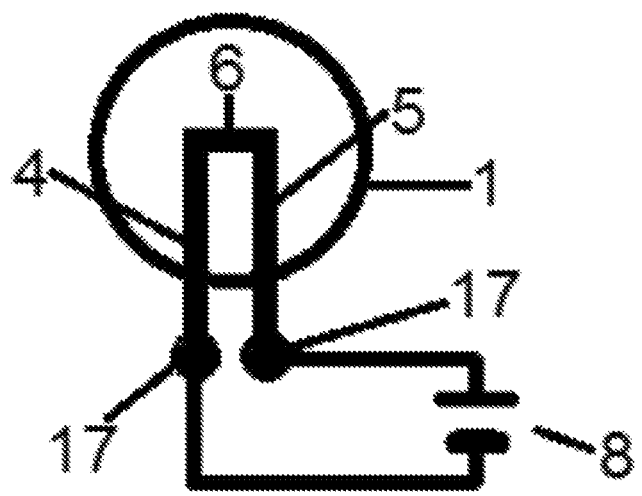
FIG. 4 is a top view on the particle vortex beam and an electrical arrangement for imparting an orbital momentum to the charged particle beam.

FIG. 4 is a top view on the particle vortex beam and an electrical arrangement for imparting an orbital momentum to the charged particle beam. FIG. 4 shows the cross section of the charged particle beam 1.

A first electrical current and the second electrical current flow along the sections 4 and 5 within the charged particle beam 1 in a tilted manner relative to the particle beam path. FIG. 4 illustrates that the diameter of the charged particle beam (1) is greater than the distances between the outer boundaries of the first electrical current and the second electrical current. The electron beam illumination area 1 is approximately restricted to the apex of the two electrical currents respectively the apex of the two sections 4 and 5 of the electrical conductor. The center of illumination area 1 and thus the center of the electron beam may cross the section 6 of the electrical conductor or may at least be arranged nearby the section 6 as shown in FIG. 4.

The invention claimed is:

1. A charged particle vortex beam generator, the generator comprising
    one or more components for providing a charged particle beam, the one or more components configured to provide an electrical arrangement which imparts an orbital angular momentum to the charged particle beam during operation, wherein the electrical arrangement comprises at least one electrical conductor for providing a first electrical current flowing in a first direction and a second electrical current flowing in a second opposite direction, wherein the first direction is anti-parallel to the second direction,
    wherein a section of the electrical conductor for said first electrical current makes an acute angle (a) with the charged particle beam path and wherein a section of the electrical conductor for said second electrical current makes an acute angle (a) with the charged particle beam path,
    wherein the section of electrical conductor for said first electrical current and the section of the electrical conductor for said second electrical current both extend to the center of the charged particle beam.

2. The generator of claim 1, wherein the section of the electrical conductor for the first electrical current is arranged on one side of the center of the charged particle beam and a second section of the electrical conductor is arranged on an opposite side of the center of the charged particle beam.

3. The generator of claim 1, wherein the electrical conductor is configured such that the first electrical current flowing in the first direction flows along a straight line and the second electrical current flowing in the second direction also flows along a straight line during operation.

4. The generator of claim 1, comprising only one single electrical conductor configured to carry an electrical current imparting an orbital angular momentum to the charged particle beam during operation.

5. The generator of claim 4, wherein the single electrical conductor is U-shaped.

6. The generator of claim 4, wherein the single electrical conductor comprises a first leg on one side of the center of charged particle beam path and a second leg on an opposite side of the center of the charged particle beam path, each of which makes an angle (a) of less than 90 degrees with the charged particle beam path.

7. The generator of claim 1, wherein the acute angle (a) is less than 80°.

8. The generator of claim 1, wherein the electrical arrangement comprises a substrate or a film and at least one electrical conductor disposed on the substrate or the film, wherein the generator is configured to cause the charged particle beam to flow nearby two legs of the electrical conductor during operation, and wherein the substrate is tilted to make an acute angle with the charged particle beam path during operation.

9. The generator of claim 8, wherein the substrate or the film upon which the electrical conductor is disposed is formed from at least one of Si and SiN.

10. The generator of claim 7, wherein the length of the legs disposed on the film is less than 100 μm.

11. The generator of claim 8, wherein the electrical arrangement comprises one or more electrical conductors formed by metal selected from Pt or Au.

12. The generator of claim 1, wherein the generator comprises an electron microscope.

13. The generator of claim 1, comprising a specimen holder, wherein the electrical arrangement is arranged between the specimen holder and the components for providing a charged particle beam.

14. The generator of claim 1, comprising a detection unit for detecting a charged particle vortex beam.

15. A method for generating a charged particle vortex beam with a generator comprising one or more components for providing a charged particle beam, the one or more components configured to provide an electrical arrangement which imparts an orbital angular momentum to the charged particle beam during operation, the method comprising the steps
    generating a charged particle beam, and
    providing an electrical arrangement so that a first electrical current flows in a first direction and a second electrical current flows in a second opposite direction,
    wherein the first direction is antiparallel to the second direction, directing the charged particle beam through the first electrical current and the second electrical current so that the electrical arrangement imparts an orbital angular momentum to the charged particle beam.

16. The method of claim 15, wherein the first electrical current and the second electrical current flow within the charged particle beam in a tilted manner relative to the particle beam path.

17. The method of claim 16, wherein the diameter of the charged particle beam is greater than the distances between the outer boundaries of the first electrical current and the second electrical current.

* * * * *